United States Patent
Yanagisawa et al.

(10) Patent No.: US 6,451,217 B1
(45) Date of Patent: Sep. 17, 2002

(54) WAFER ETCHING METHOD

(75) Inventors: Michihiko Yanagisawa; Chikai Tanaka; Shinya Iida, all of Ayase; Yasuhiro Horiike, 2-12, Higashifushimi 3-chome, Houya-shi, Tokyo, all of (JP)

(73) Assignees: SpeedFam-IPEC Co., Ltd., Ayase (JP); Yasuhiro Horiike, Tokyo (JP)

( * ) Notice: Subject to any disclaimer, the term of this patent is extended or adjusted under 35 U.S.C. 154(b) by 0 days.

(21) Appl. No.: 09/514,676

(22) Filed: Feb. 28, 2000

Related U.S. Application Data (63) Continuation-in-part of application No. 09/283,513, filed on Apr. 1, 1999, now abandoned.

(30) Foreign Application Priority Data

Jun. 9, 1998 (JP) .......................................... 10-176669
May 12, 1999 (JP) .......................................... 11-132032

(51) Int. Cl.$^7$ .......................................... H01L 21/3065
(52) U.S. Cl. ........................ 216/67; 216/69; 216/79; 438/715; 438/719; 438/727
(58) Field of Search ........................ 216/67, 69, 79; 438/710, 719, 909, 715, 727

(56) References Cited

U.S. PATENT DOCUMENTS

| | | | |
|---|---|---|---|
| 4,052,251 A | | 10/1977 | Weitzel ........................ 156/612 |
| 4,462,863 A | * | 7/1984 | Nishimatsu et al. ........... 216/70 |
| 4,465,552 A | * | 8/1984 | Bobbio et al. ......... 204/192.32 |
| 4,731,158 A | * | 3/1988 | Brannon ...................... 156/345 |
| 4,971,653 A | * | 11/1990 | Powell et al. ................ 156/345 |
| 4,992,136 A | | 2/1991 | Tachi et al. .................. 156/643 |
| 5,347,100 A | * | 9/1994 | Fukuda et al. .......... 219/121.43 |
| 5,383,984 A | * | 1/1995 | Shimada et al. ...... 118/723 ER |
| 5,419,805 A | * | 5/1995 | Jolly .......................... 438/669 |
| 5,423,942 A | * | 6/1995 | Robbins et al. .............. 216/67 |
| 5,515,986 A | * | 5/1996 | Turlot et al. ................ 118/719 |
| 5,968,845 A | * | 10/1999 | Chino et al. .................. 216/63 |
| 5,980,769 A | * | 11/1999 | Yanagisawa et al. ......... 216/67 |
| 6,046,116 A | * | 4/2000 | DeOrnellas et al. .......... 216/71 |
| 6,091,060 A | * | 7/2000 | Getchel et al. ............. 118/725 |
| 6,110,322 A | * | 8/2000 | Teoh et al. ............. 118/723 E |
| 6,136,213 A | * | 10/2000 | Shinozuka et al. ......... 156/345 |

(List continued on next page.)

FOREIGN PATENT DOCUMENTS

| | | | |
|---|---|---|---|
| DE | 33 18566 A1 | 11/1983 | |
| EP | 0 843 336 A2 | 5/1998 | |
| EP | 0 975 016 A1 | 1/2000 | |
| EP | 1 004 401 A2 | 5/2000 | |
| EP | 1 035 576 A2 | 9/2000 | |
| JP | 03-259519 | 11/1991 | |
| JP | 09027482 A * | 1/1997 | |
| JP | 10-226892 | 8/1998 | |
| JP | 11031677 A * | 2/1999 | ............. C23F/4/00 |
| JP | 11067736 A * | 3/1999 | ............. C23F/4/00 |
| JP | 11260806 A * | 9/1999 | ......... H01L/21/302 |
| JP | 2000133639 A * | 5/2000 | ....... H01L/21/3065 |
| JP | 2000232097 A * | 8/2000 | ............. C23F/4/00 |

Primary Examiner—Anita Alanko
(74) Attorney, Agent, or Firm—Burr & Brown (57) ABSTRACT

A wafer etching method wherein hydrogen gas, ammonia gas or mixed gas containing one of these gases is added to sulfur hexafluoride gas to suppress the occurrence of white turbidity on the surface of the wafer at the time of etching and to enable high quality mirror polishing of the wafer. In one embodiment, a mixed gas obtained by mixing $SF_6$ gas G1 of a bomb 31 and $H_2$ gas G2 of a bomb 32 in a predetermined ratio is fed to a discharge tube 2 and a microwave M is generated from a microwave oscillator 4 to cause plasma discharge. Further, the entire surface of the silicon wafer W can be flattened by locally etching the surface of the silicon wafer W by an activated species gas G sprayed from the nozzle portion 20.

8 Claims, 7 Drawing Sheets

U.S. PATENT DOCUMENTS

| | | | |
|---|---|---|---|
| 6,159,388 A | 12/2000 | Yanagisawa et al. | 216/60 |
| 6,184,148 B1 * | 2/2001 | Nakamura | 438/715 |
| 6,254,718 B1 * | 7/2001 | Tanaka et al. | 118/504 |
| 6,280,645 B1 * | 8/2001 | Yanagisawa et al. | 216/38 |
| 6,302,995 B1 * | 10/2001 | Tanaka et al. | 156/345 |
| 6,303,511 B2 * | 10/2001 | Yanagisawa et al. | 438/710 |
| 6,309,780 B1 * | 10/2001 | Smith | 430/5 |
| 6,316,369 B1 * | 11/2001 | Yanagisawa et al. | 156/345 |
| 6,360,687 B1 * | 3/2002 | Yanagisawa et al. | 118/695 |
| 2001/0007275 A1 * | 7/2001 | Yanagisawa et al. | 156/345 |
| 2001/0018271 A1 * | 8/2001 | Yanagisawa | 438/697 |
| 2001/0020712 A1 * | 9/2001 | Raaijmakers et al. | 257/301 |
| 2001/0032705 A1 * | 10/2001 | Sadohara et al. | 156/345 |
| 2002/0008082 A1 * | 1/2002 | Tanaka et al. | 216/67 |

* cited by examiner

ately tick portion Wa, at the same time as the activated

WAFER ETCHING METHOD

CROSS REFERENCE TO RELATED APPLICATION

This is a continuation-in-part application of U.S. Ser. No. 09/283,513, filed Apr. 1, 1999, now abandoned, the entirety of which is incorporated herein by reference.

BACKGROUND OF THE INVENTION

1. Field of the Invention

The present invention relates to a wafer etching method for locally etching relatively thick portions present on the surface of a wafer.

2. Description of the Related Art

In recent years, a wafer etching method has been devised which locally etches relatively thick portions on the surface of a silicon wafer etc. to thin the wafer and flatten the surface and thereby reduce the variation in shape, that is, the total thickness variation (TTV) or local thickness variation (LTV).

Figure 7:
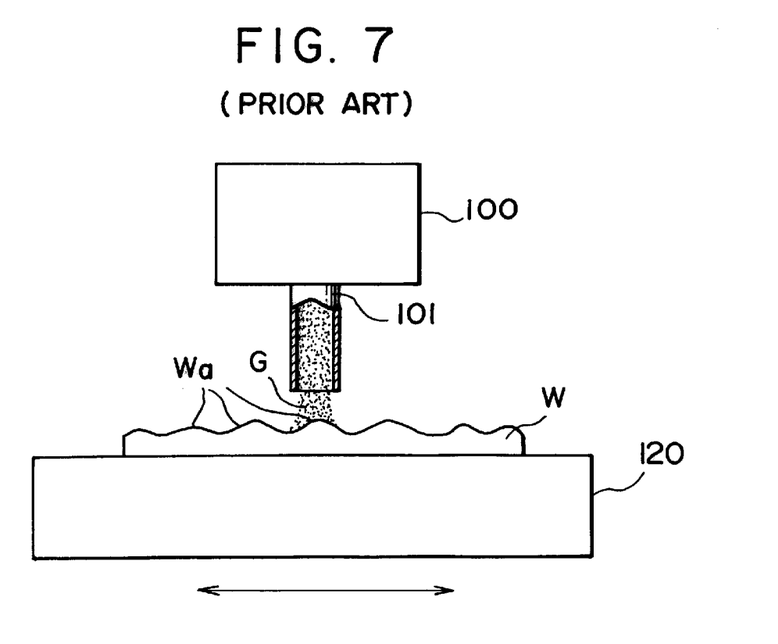
FIG. 7 is a schematic view of a wafer etching method of the related art.

FIG. 7 is a schematic view of a wafer etching method of the related art.

In FIG. 7, reference numeral 100 represents a plasma generator. The plasma generator 100 causes plasma discharge of sulfur hexalluoride ($SF_6$) to generate an activated species gas C containing fluorine (F) ions and radicals. This activated species gas C is sprayed onto the surface of a silicon wafer W from a nozzle 101.

The silicon wafer W is fixed on a stage 120. The stage 120 is made to move in the horizontal direction and the nozzle 101 made to scan the entire surface of the silicon wafer W, whereby portions Wa relatively thicker than the prescribed thickness on the surface of the silicon wafer W (hereinafter referred to as the "relatively thick portions") are led directly under the nozzle 101.

Due to this, the activated species gas G is sprayed on the protruding relatively thick portions Wa from the nozzle 101 and the relatively thick portions Wa are locally etched, whereby the surface of the silicon wafer W is flattened.

Figure 8:
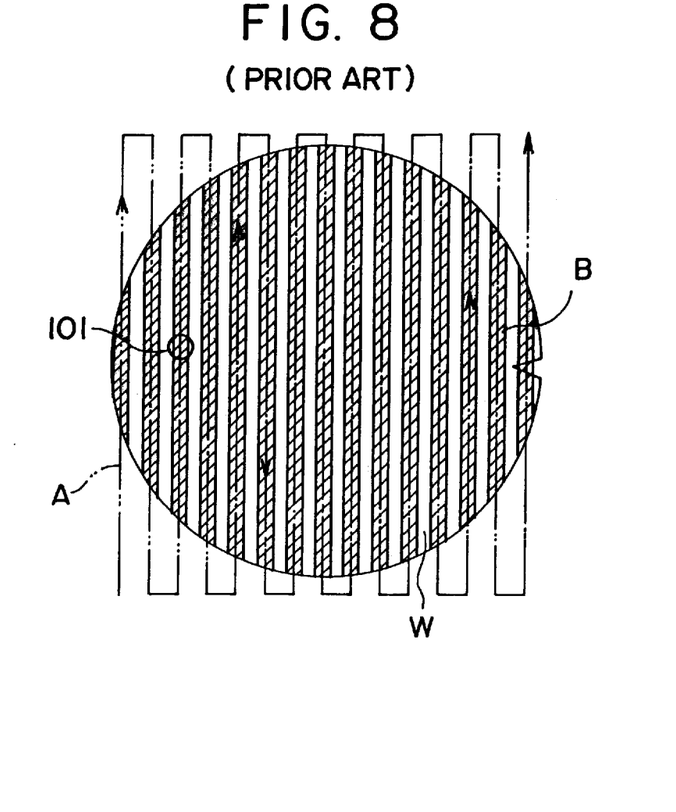
FIG. 8 is a plan view of the state of occurrence of white turbidity on the surface of a silicon wafer etched by the wafer etching method of the related art.

In this wafer etching method using $SF_6$ gas, however, as shown by the hatching in FIG. 8, white turbidity B occurs at the surface of the silicon wafer W along the line of scanning A of the nozzle 101 at the time of etching. Not only is the surface of the silicon wafer W contaminated, but also the white turbidity inhibits uniform etching and can cause the TTV and LTV to become worse than desired.

As opposed to this, there is a wafer etching method which causes plasma discharge of carbon tetrafluoride ($CF_4$). If this method is used, no white turbidity B is formed at the surface of the silicon wafer W, but the etching rate is much slower than the method using $SF_6$ gas.

Therefore, a wafer etching method using $SF_6$ which does not cause white turbidity has been desired.

Figure 9:
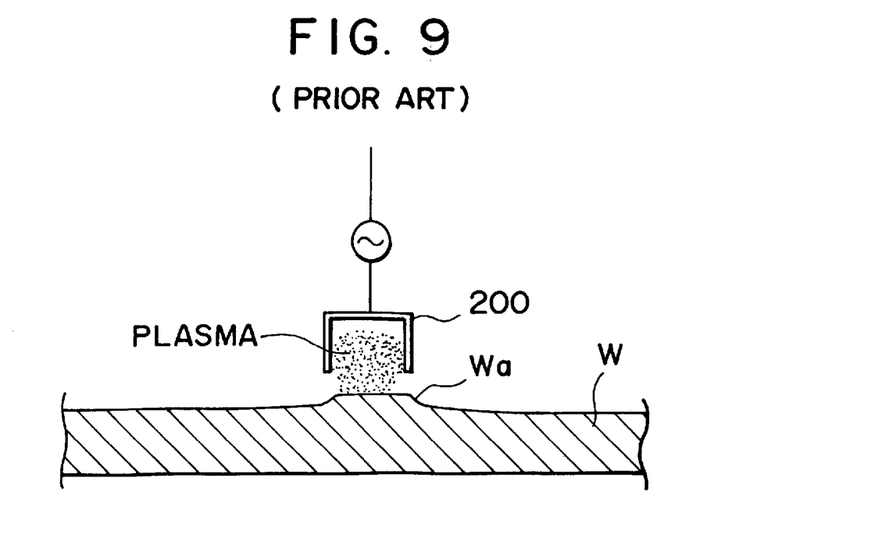
FIG. 9 is a sectional view of the wafer etching method of another related art.

As one example of such a technique, there is the technique shown in FIG. 9.

In this technique, the silicon wafer W is placed in a low atmospheric pressure environment of 1 Torr. A small discharge chamber 200 serving also as an electrode and filled with $SF_6$ gas is brought close to a relatively thick portion Wa. In that state, plasma discharge of the $SF_6$ gas is caused at a high frequency of 13.56 MHZ, whereby the relatively thick portion Wa is locally etched. At his time, since the plasma in the discharge chamber 200 is close to the relatively tick portion Wa, at the same time as the activated species gas G is etching the relatively thick portion Wa, the ions in the activated species gas G strike the relatively thick portion Wa. Therefore, it is believed the white turbidity is eliminated by the impact of the various types of ions and no white turbidity remains on the surface of the silicon wafer Wa.

In this wafer etching method of the related art shown in FIG. 9, however, since the ions in the activated species gas G strike the surface of the silicon wafer W, the crystal structure of the silicon wafer W is disturbed, impurities caused by the collisions of the various types of ions enter into the silicon wafer W, and a high quality mirror polish of the silicon wafer W might not be able to be achieved. Further, with this method, while it is not possible to discern the white turbidity visually under natural light the white turbidity can be seen under a condenser type lamp. It is not possible to completely prevent the occurrence of white turbidity by this method.

As opposed to this, the apparatus shown in FIG. 7 uses $SF_6$ gas, has a plasma discharge position far away from the silicon wafer W, and sprays only activated species gas G to the silicon wafer W. Therefore, so long as the silicon wafer W is etched by this apparatus, no disturbance occurs in the crystal structure of the silicon wafer W. The present inventors used this apparatus and added hydrogen ($H_2$) gas to the $SF_6$ gas to locally etch the silicon wafer W, then inspected the surface of the silicon wafer W visually, whereupon they discerned no white turbidity. This is believed to be because the occurrence of white turbidity was suppressed by the presence of the hydrogen fluoride (HF) produced by the reaction between the fluorine (F) radicals and $H_2$. Further, with this method, since the ions in the activated species gas G do not strike the silicon wafer W. the crystal structure of the surface portion of the silicon wafer W is not disturbed Further, it is believed that by heating the silicon wafer W to a predetermined temperature, it is possible to completely prevent the occurrence of white turbidity on the surface of the silicon wafer W.

Figure 10:
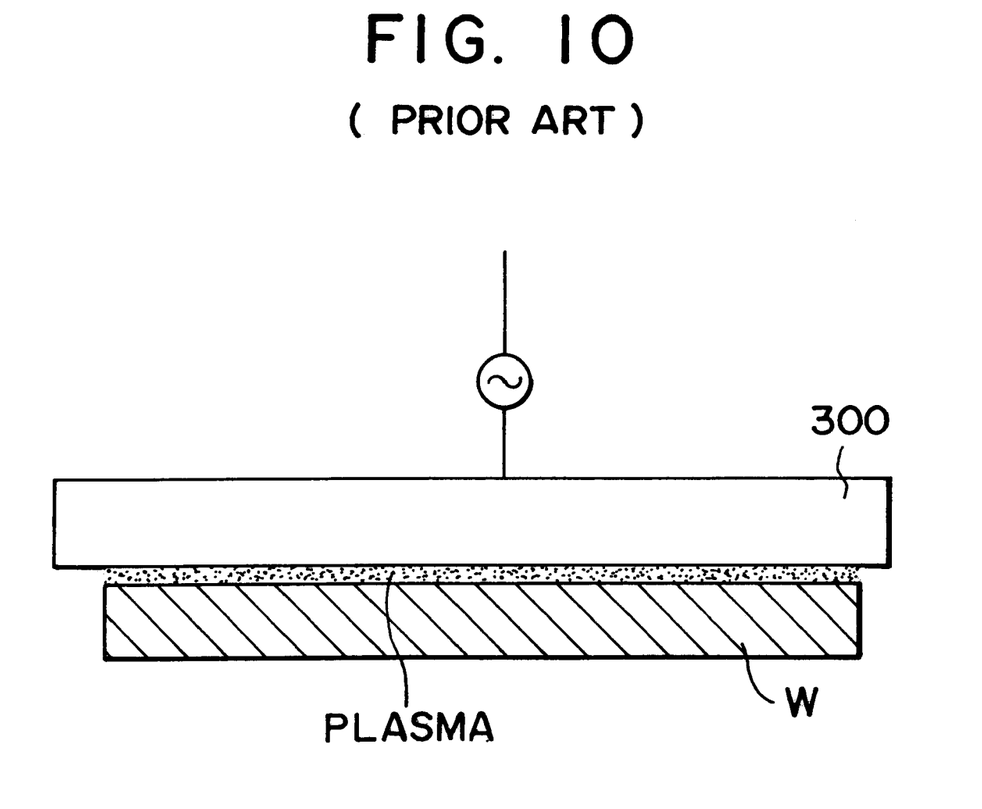
FIG. 10 is a sectional view of a wafer etching method of the related art for etching the surface of a silicon wafer W by $SF_6$ gas plus $H_2$ gas.

Note that as shown in FIG. 10, there is a technique for etching the surface of a silicon wafer W by adding $H_2$ gas to $SF_6$ gas.

This technique arranges the silicon wafer W inside a high atmospheric pressure environment of 1500 Torr. A drum shaped electrode 300 longer than the diameter of the silicon wafer W is brought close to the silicon wafer W and the $SF_6$ gas with the added $H_2$ gas is interposed in the slight clearance between the electrode 300 and the silicon wafer W. In this state, plasma discharge of the gas is caused by a high frequency of 150 MHZ, whereby the surface of the silicon wafer W is etched. Further, in this technique as well, the plasma discharge position is made close to the silicon wafer W, so similar problems arise as with the technique shown in FIG. 9. Further, since the atmospheric pressure is high, the temperature of the gas rises. As a result, the temperature of the wafer rises and problems such as warping of the wafer occurs. Further, it is not possible to suppress the occurrence of white turbidity.

SUMMARY OF THE INVENTION

An object of the present invention is to provide a wafer etching method which adds hydrogen gas, ammonia gas or mixed gas containing one of these gases to sulfur hexafluoride gas and thereby suppresses the occurrence of white turbidity at the surface of the wafer at the time of etching and enables a high quality mirror polish to the wafer.

To achieve this object, according to an aspect of he present invention, there is provided a wafer etching method comprising: a plasma generation step for converting sulfur hexafluoride gas to plasma at a discharge position in a discharge tube to generate; an activated species gas; and a spraying step for spraying the activated species gas onto a relatively thick portion of the wafer, in a state where a nozzle portion of the discharge tube leading the activated species gas generated at the discharge position to the wafer side is made to face the relatively thick portion of the wafer, so as to locally etch the relatively thick portion, wherein hydrogen gas, ammonia gas or mixed gas containing one of these gases is added to the activated species gas in a predetermined ratio.

Due to this configuration, in the plasma generation step, the sulfur hexafluoride gas is converted to plasma at the discharge position in the discharge tube to generate an activated species gas. Further, in the spraying step, the activated species gas generated at the discharge position is led by the nozzle portion to the wafer side and the activated species gas from the nozzle portion facing a relatively thick portion of the wafer is sprayed to the relatively thick portion whereby the relatively thick portion is locally etched. At this time, since the wafer is etched by the activated species gas comprised primarily of the sulfur hexafluoride gas, the etching rate is extremely high. Further, since the activated species gas is sprayed for etching from a nozzle portion away from the discharge position where the plasma is generated, the crystal structure of the wafer surface is not disturbed. Further, since hydrogen gas, ammonia gas or mixed gas containing one of these gases is added in a predetermined ratio to the activated species gas, the occurrence of white turbidity on the wafer surface can be suppressed.

Any method may be used to add the hydrogen gas, ammonia gas or mixed gas containing one of these gases to the activated species gas. As one example, according to an aspect of the invention, a mixed gas comprising the sulfur hexafluoride gas in which hydrogen gas, ammonia gas or mixed gas containing one of these gases is mixed at a predetermined ratio is fed to the discharge position in the discharge tube to generate an activated species mixed gas containing the activated species gas and the activated species mixed gas is sprayed from the nozzle portion.

Further, according to an aspect of the invention, the hydrogen gas, ammonia gas or mixed gas containing one of these gases is fed at a predetermined ratio from a gas feed pipe connected near the nozzle portion to the inside of the nozzle portion to generate an activated species mixed gas containing the activated species gas and the activated species mixed gas is sprayed from the nozzle portion.

Further, to maintain the etching rate at the desired level, it is preferable to etch by just the activated species gas comprised of the sulfur hexafluoride as much as possible. Therefore, according to an aspect of the invention, the activated species mixed gas is sprayed from the nozzle portion so as not to strike the wafer and to make the area around the wafer an atmosphere of the activated species mixed gas, then just sulfur hexafluoride gas is converted to plasma to generate an activated species gas for etching the wafer.

Any ratio of the hydrogen gas, ammonia gas or mixed gas containing one of these gases may be used, but as a good example, according to an aspect of the invention, the hydrogen gas, ammonia gas or mixed gas containing one of these gases is added in an amount of between 0.1 to 30 percent with respect to the mixed gas or the activated species mixed gas.

Further, a high precision of local etching would be possible if it were possible to suppress the dispersion of the activated species gas sprayed from the nozzle portion. Therefore, according to an aspect of the invention, hydrogen gas, ammonia gas or mixed gas containing one of these gases is filled around the activated species gas sprayed from the nozzle portion.

Due to this configuration, it is possible to suppress the dispersion of the activated species gas by the hydrogen gas, ammonia gas or mixed gas containing one of these gases and possible to make the diameter etched by the activated species gas a desired size.

Further, according to an aspect of the invention, there further comprises a heating step for heating the surface of the wafer to a predetermined temperature.

Due to this configuration, it is possible to substantially completely suppress the occurrence of white turbidity to an extent where white turbidity cannot be visually discerned even under a condenser type lamp.

Further, as a good example of the wafer heating temperature, according to an aspect of the invention, the heating temperature of the wafer in the heating step is set to a temperature between 60° C. to 170° C.

BRIEF DESCRIPTION OF THE DRAWINGS

The above and other objects, features, and advantages of the present invention will become more readily apparent from the following description of presently preferred embodiments of the invention taken in conjunction with the accompanying drawings, in which.

DESCRIPTION OF THE PREFERRED EMBODIMENTS

Preferred embodiments of the present invention will be explained below with reference to the drawings.
(First Embodiment)

Figure 1:
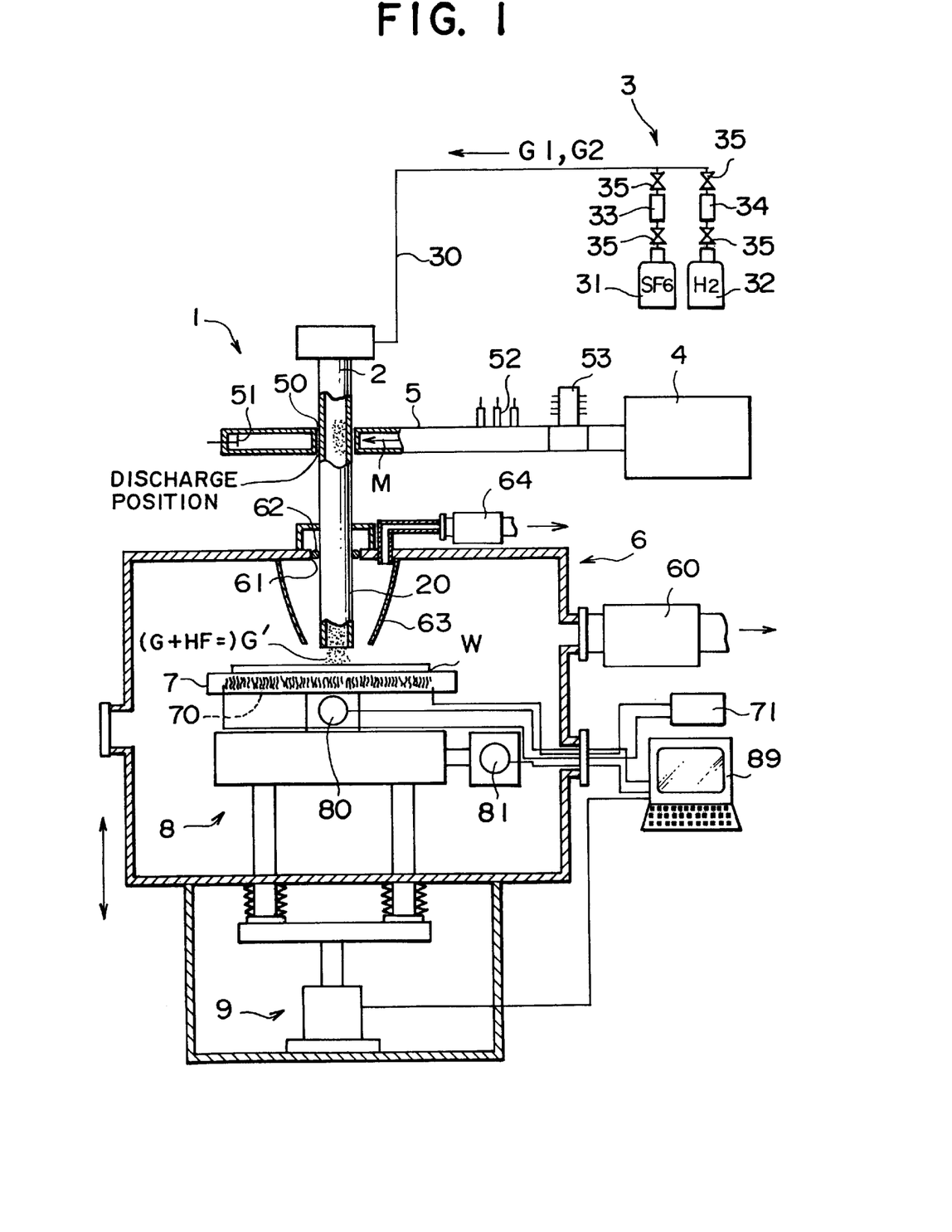
FIG. 1 is a structural view of a wafer etching apparatus for realizing a wafer etching method according to a first embodiment of the present invention.

FIG. 1 is a structural view of a wafer etching apparatus for realizing a wafer etching method according to a first embodiment of the present invention.

This wafer etching apparatus is provided with a plasma generator 1 and a chamber 6 for accommodating a silicon wafer W.

The plasma generator 1 has a discharge tube 2 formed by quartz or alumina, a gas feed system 3, a microwave oscillator 4, and a wave guide 5.

The discharge tube 2 is a cylindrical body serving also as a nozzle portion 20 at its bottom end and having a feed pipe 30 of the gas feed system 3 connected to its top end.

The gas feed system 3 is a system for feeding a gas into the discharge tube 2 and has a bomb 31 for the $SF_6$ gas and a bomb 32 for the $H_2$ gas. The bombs 31 and 32 are connected through flow control devices 33 and 34 to a feed pipe 30.

Note that reference numerals 35 indicate valves.

The microwave oscillator 4 is a magnetron and can generate a microwave M of a predetermined frequency.

The wave guide 5 is for guiding the microwave M generated from the microwave oscillator 4 and is connected to the discharge tube 2 through a hole 50.

At the inside of the left end of this wave guide 5 is attached a reflection plate (shot plunger) 51 for reflecting the microwave M and forming a standing wave. Further, in the middle of the wave guide 5 are attached a 3-stub tuner 52 for phase adjustment with the microwave M and an isolator 53 for bending the reflected microwave M heading toward the microwave oscillator 4 90° in direction (surface direction of FIG. 1).

By adopting this configuration of a plasma generator 1, when gas is fed from the gas feed system 3 to the discharge tube 2 and a microwave M is generated from the microwave oscillator 4, plasma discharge is caused at the position of the discharge tube 2 corresponding to the hole 50 and the gas produced by this plasma discharge is sprayed from the nozzle portion 20.

In this wafer etching apparatus, however, the position of insertion of the waveguide 5 over the microwave oscillator 4, that is, the discharge position, is set far above the nozzle portion 20. Therefore, the plasma generated at the discharge position does not contribute itself to the etching of the silicon wafer W. Only the activated species gas G generated by the plasma discharge contributes to the etching of the silicon wafer W.

On the other hand, the chamber 6 is a box-shaped member for accommodating the silicon wafer W and is evacuated by a vacuum pump 60.

At the center of the top surface of the chamber 6 is formed a hole 61. The nozzle portion 20 of the discharge tube 2 is inserted into the chamber 6 through this hole 61. Between the hole 61 and the discharge tube 2 is fit an O-ring 62. The space between the hole 61 and the discharge tube 2 therefore can be held air-tight and the chamber 6 as a whole can be moved vertically with respect to the discharge tube 2.

Around the nozzle portion 20 inserted in the hole 61 is provided with a duct 63. The vacuum pump 64 is driven to discharge the reaction product gas of the etching outside of the chamber 6.

Further a chuck 7 is arranged inside the chamber 6. The silicon wafer W is held by this chuck 7.

The chuck 7 is an electrostatic chuck and has a mechanism for holding the silicon wafer W by the force of static electricity. Further, inside the chuck 7, as shown by the broken line, is housed a heater 70. By turning the power supply 71 on, it is possible to heat the silicon wafer W to a predetermined temperature.

The chuck 7 is supported by an X-Y drive mechanism 8.

Further the chamber 6 as a whole is supported by a Z-drive mechanism 9.

Specifically, the chuck 7 is moved laterally in FIG. 1 by the X-drive motor 80 of the X-Y drive mechanism 8. The chuck 7 and the X-drive motor 80 are designed to be moved together in a direction perpendicular to the surface of the paper showing FIG. 1 by the Y-drive motor 81. Further, the chamber 6 as a whole is designed to be moved vertically by a Z-drive motor 90 of the Z-drive mechanism 9.

That is, it is possible to make the nozzle portion 20 move relative to the silicon wafer W in the X-Y direction by the X-Y drive mechanism 8 and possible to make it move in the vertical direction by the Z-drive mechanism 9.

The drive operations of the X-drive motor 80 and Y-drive motor 81 of the X-Y drive mechanism 8 and the Z-drive motor 90 of the Z-drive mechanism 9 are controlled by a control computer 89 based on a predetermined program.

Next, an explanation will be made of a method for executing the wafer etching method of this embodiment using the wafer etching apparatus of the above configuration.

First, in the state with the silicon wafer W held by the chuck 7, the vacuum pump 60 is driven to make the inside of the chamber 6 a low atmospheric pressure state of 0.1 Torr to 5.0 Torr and the Z-drive mechanism 9 is driven to raise the chamber 6 as a whole and bring the silicon wafer W about 5 mm below the nozzle portion 20.

In this state, the valves 35 of the gas feed system 3 are opened and the $SF_6$ gas G1 in the bomb 31 and the $H_2$ gas G2 inside the bomb 32 are fed into the discharge tube 2 through the flow control devices 33 and 34 and the feed pipe 30.

At this time, the opening degrees of the valves 35 are adjusted to maintain the pressures of the $SF_6$ gas G1 and the $H_2$ gas G2 at predetermined levels and the flow control devices 33 and 34 are used to adjust the flow rates of the $SF_6$ gas G1 and $H_2$ gas G2 to set the ratio of the $H_2$ gas G2 to the mixed gas of the $SF_6$ gas G1 and $H_2$ gas G2 fed into the discharge tube 2 to a value between 0.1 percent to 30 percent.

If the microwave oscillator 4 is driven in parallel with the operation of feeding the mixed gas, the microwave M will cause plasma discharge of the mixed gas present at the discharge position and the activated species gas G and HF gas G3 will be produced (plasma generation step).

When this happens, the activated species mixed gas G' containing the activated species gas G and the HF gas is guided to the nozzle portion 20 and sprayed from the opening of the nozzle portion 20 to the silicon wafer W side.

In this state, the control computer 89 drives the X-Y drive mechanism 8 to move the chuck 7 holding the silicon wafer W zigzag in the X-Y direction.

Figure 2:
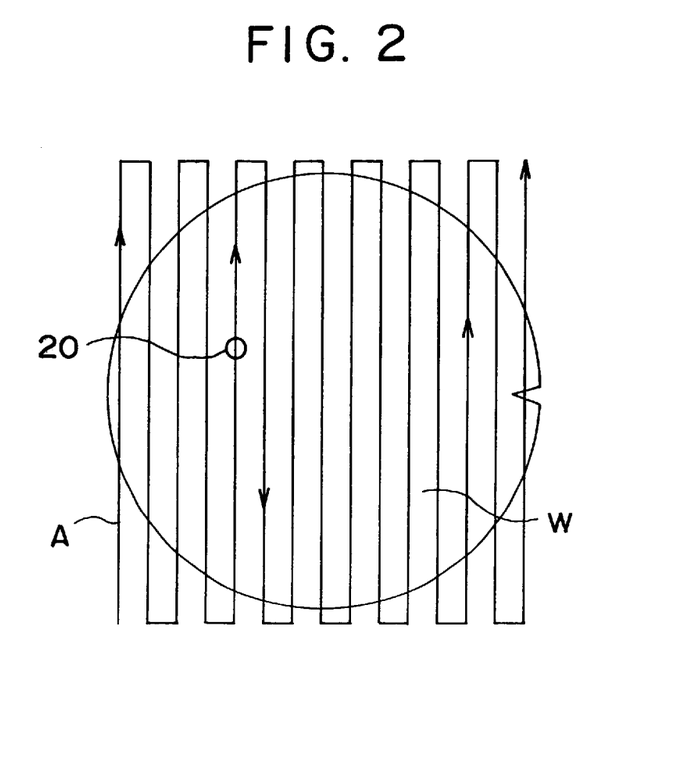
FIG. 2 is a plan view of the scanning pattern of the wafer.

That is, as shown in FIG. 2, the nozzle portion 20 is made to scan relative to the silicon wafer W in a zigzag. At this time, the relative speed of the nozzle portion 20 with respect to the silicon wafer W is set to be substantially inversely proportional to the thickness of a relatively thick portion.

Figure 3:
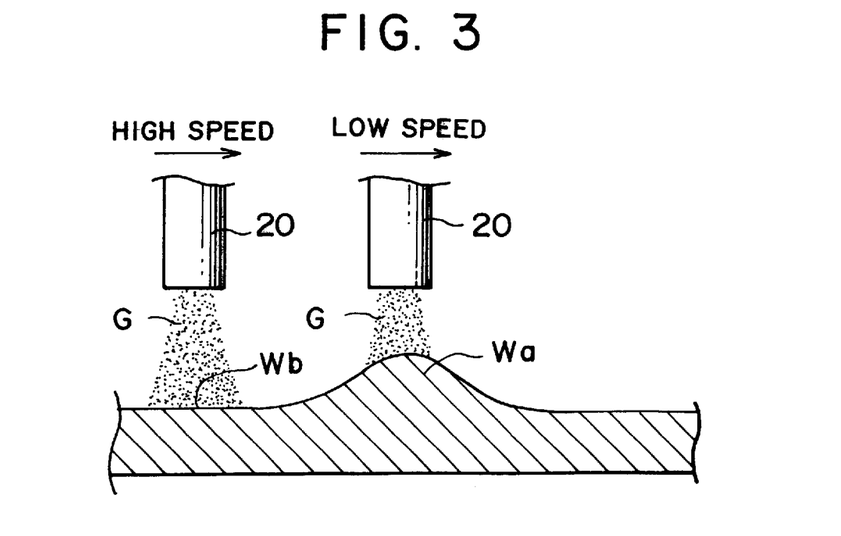
FIG. 3 is a sectional view of the state of local etching of a relatively thick portion.

Due to this, as shown in FIG. 3, the nozzle portion 20 moves at a high speed directly above a non-relatively thick portion Wb. When arriving above a relatively thick portion Wa, the speed is lowered in accordance with the thickness of the relatively thick portion Wa. As a result, the etching time with respect to the relatively thick portion Wa becomes longer and the relatively thick portion Wa is shaved flat (spraying step).

Further, the gaseous reaction product produced at the time of such etching is discharged outside of the chamber 6 from the duct 63 by the vacuum pump 64 shown in FIG. 1.

Since, however, plasma discharge of the mixed gas of the $SF_6$ gas G1 and the $H_2$ gas G2 is caused at the time of etching, an activated species mixed gas G' containing the activated species gas G containing F radicals and HF gas produced by a reaction between the F radicals and $H_2$ gas G2 is blown on to the silicon wafer W. Therefore, it is believed that the HF gas in the activated species mixed gas G' acts chemically and physically on the surface of the silicon wafer W and suppresses white turbidity on the surface of the silicon wafer W.

Further, since the silicon wafer W is etched by the activated species gas G obtained by the plasma discharge of the $SF_6$ gas G1, the etching rate is fast.

Further, since the discharge position of the plasma is set to a position far above the silicon wafer W (for example, a position 15 cm above the surface of the silicon wafer W), the plasma generated at the discharge position will not itself affect the etching of the silicon wafer W. That is, the plasma only will function as a source of production of the activated species gas G. The silicon wafer w is etched only by the activated species gas G. Therefore, there will be no disturbance of the crystal structure of the surface of the silicon wafer W by ions in the activated species gas G striking the silicon wafer W as in the related art shown in FIG. 9.

The present inventors engaged in the following comparative experiments to verify the above advantageous effect.

First, in a first experiment, an 8-inch silicon wafer W was held by a chuck 7 in a chamber 6 held at 1 Torr, a valve 35 of the gas feed system 3 was opened, and the flow control device 33 was adjusted to feed 200 SCCM, that is, 200 liters per minute, of $SF_6$ gas from the bomb 31 to the discharge tube 2. A microwave M of an output of 300 W was generated from the microwave oscillator 4 to cause plasma discharge of the $SF_6$ gas. Further, as shown in FIG. 2, the nozzle portion 20 was made to scan the surface in a zigzag at a pitch of 8 mm to etch the entire surface of the silicon wafer W by the activated species gas G sprayed from the nozzle portion 20. This being done, it was visually confirmed under natural light that the white turbidity B shown in FIG. 8 occurred along the scanning line A on the surface of the silicon wafer W after etching.

Next, the inventors conducted a second experiment, in which the valve 35 was opened and the flow control devices 33 and 34 were adjusted to output 200 SCCM of $SF_6$ gas G1 from the bomb 31 and output 10 SCCM of $H_2$ gas G2 from the bomb 32 and feed this mixed gas to the discharge tube 2. Note that the other conditions were set the same as the conditions of the above first experiment. This being done, the occurrence of white turbidity could not be visually discerned under natural light at the surface of the silicon wafer W after etching. Further, it was possible to obtain a good quality mirror surface without disturbance of the crystal structure.

(Second Embodiment)

In the first embodiment explained above, it was possible to keep down the occurrence of white turbidity to a degree where it could not be visually discerned under natural light. If the surface of the silicon wafer W after etching is viewed under a condenser type lamp, however, thin white turbidity traces are observed. The same is true in the wafer etching method using $CF_4$ gas explained above.

A silicon wafer W having this extent of white turbidity is acceptable as a finished product, but to obtain a further higher quality mirror surface, it is necessary to give a mirror polish to the surface of the silicon wafer W by a chemical mechanical polishing (CMP) apparatus. Therefore, in this case, a mirror polishing step is needed, therefore the equipment costs more and the processing time of the work ends up becoming longer.

In consideration of this point, in this embodiment, a heating step is provided which is able to substantially completely prevent the occurrence of white turbidity at the surface of the silicon wafer W without causing a rise in the cost of the equipment etc.

Specifically, the same procedure as with the wafer etching method of the first embodiment is performed and the power supply 71 is turned on to operate the heater 70 at the time of etching the silicon wafer W so as to heat the silicon wafer W to a temperature between 60° C. to 170° C.

Due to this, the white turbidity on the surface of the silicon wafer W is reduced to an extent where it cannot be visually discerned even under a condenser type lamp.

The present inventors verified this advantageous effect by conducting an experiment in which a silicon wafer W was etched under conditions similar to those of the above second experiment and the heater 70 was used to heat the silicon wafer W to a temperature of 80° C.

This being done, the occurrence of white turbidity on the surface of the silicon wafer W was substantially completely suppressed and white turbidity could not be visually discerned even under a condenser type lamp.

In this way, according to the wafer etching method of this embodiment, it is possible to perform processing the same as the above mirror polishing by a simple piece of equipment and possible to reduce the cost of the equipment and shorten the processing time.

(Third Embodiment)

Figure 4:
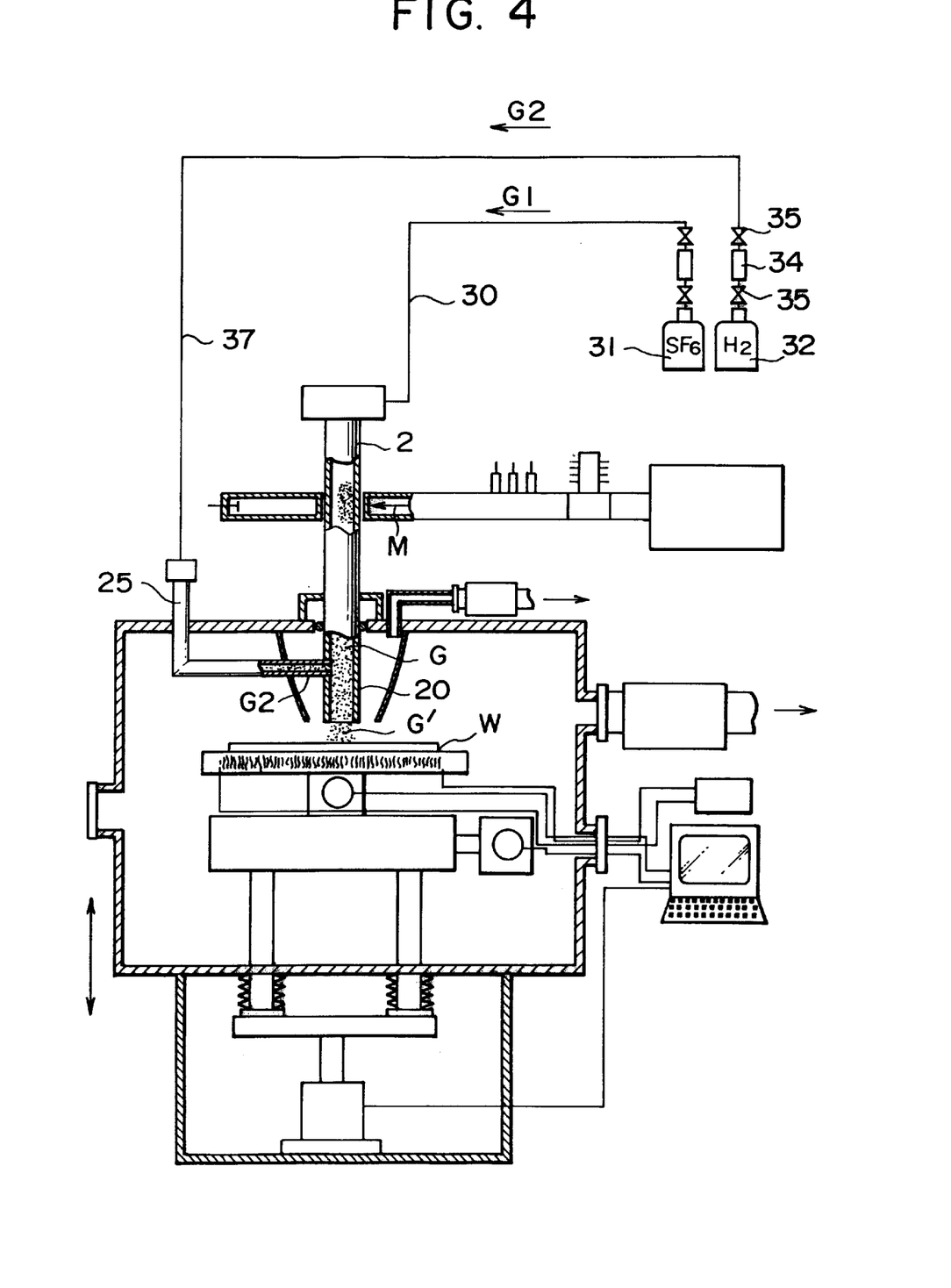
FIG. 4 is a structural view of a wafer etching apparatus for realizing a wafer etching method according to a third embodiment of the present invention.

FIG. 4 is a structural view of a wafer etching apparatus for realizing a wafer etching method according to a third embodiment of the present invention.

This wafer etching apparatus is structured with an L-shaped hydrogen gas feed pipe 25 connected to the nozzle portion 20, a feed pipe 37 connected to the hydrogen gas feed pipe 25, and a bomb 32 connected to this feed pipe 37 through a valve 35 and a flow control device 34.

Due to this, when the $SF_6$ gas G1 is fed from the bomb 31 through the feed pipe 30 to the discharge tube 2 and the $H_2$ gas G2 is fed through the feed pipe 37 to the hydrogen gas feed pipe 25, the $H_2$ gas G2 discharged from the hydrogen gas feed pipe 25 is added to the activated species gas G produced by the plasma discharge of the $SF_6$ gas G1 and flowing to the nozzle portion 20 side. As a result, the activated species mixed gas G' produced by the addition of the $H_2$ gas G2 is sprayed from the opening of the nozzle portion 20 to the surface of the silicon wafer W.

The rest of the configuration, mode of operation, and advantageous effects are similar to those of the above first and second embodiments, so explanations thereof will be omitted.

(Fourth Embodiment)

The HF gas produced by the reaction of the F radicals of the activated species gas G and the $H_2$ gas G2 is believed to suppress the occurrence of white turbidity, but is not involved in the etching of the silicon wafer W. Therefore, in this embodiment, first, before placing the silicon wafer W in the chamber 6, in the same way as the first to third embodiments, an activated species mixed gas G' containing HF gas obtained by adding $H_2$ gas G2 to the $SF_6$ gas G1 (or activated species gas G) is sprayed from the nozzle portion 20 to the inside of the chamber 6 to make the inside of the chamber 6 an HF gas atmosphere of a predetermined concentration. Due to this, an environment capable of preventing the occurrence of white turbidity on the surface of the silicon wafer W is created around the silicon wafer W.

Suitably thereafter, the silicon wafer W is conveyed into the chamber 6 and held by the chuck 7. In that state, only the $SF_6$ gas G1 of the bomb 31 is fed to the discharge tube 2 and only the activated species gas G produced by the plasma discharge etches the silicon wafer W.

Due to this, the etching portion of the silicon wafer W is directly etched by the activated species gas G and the etching rate is improved.

The rest of the configuration, mode of operation, and advantageous effects are similar to those of the above first to third embodiments, so explanations thereof will be omitted.

(Fifth Embodiment)

Figure 5:
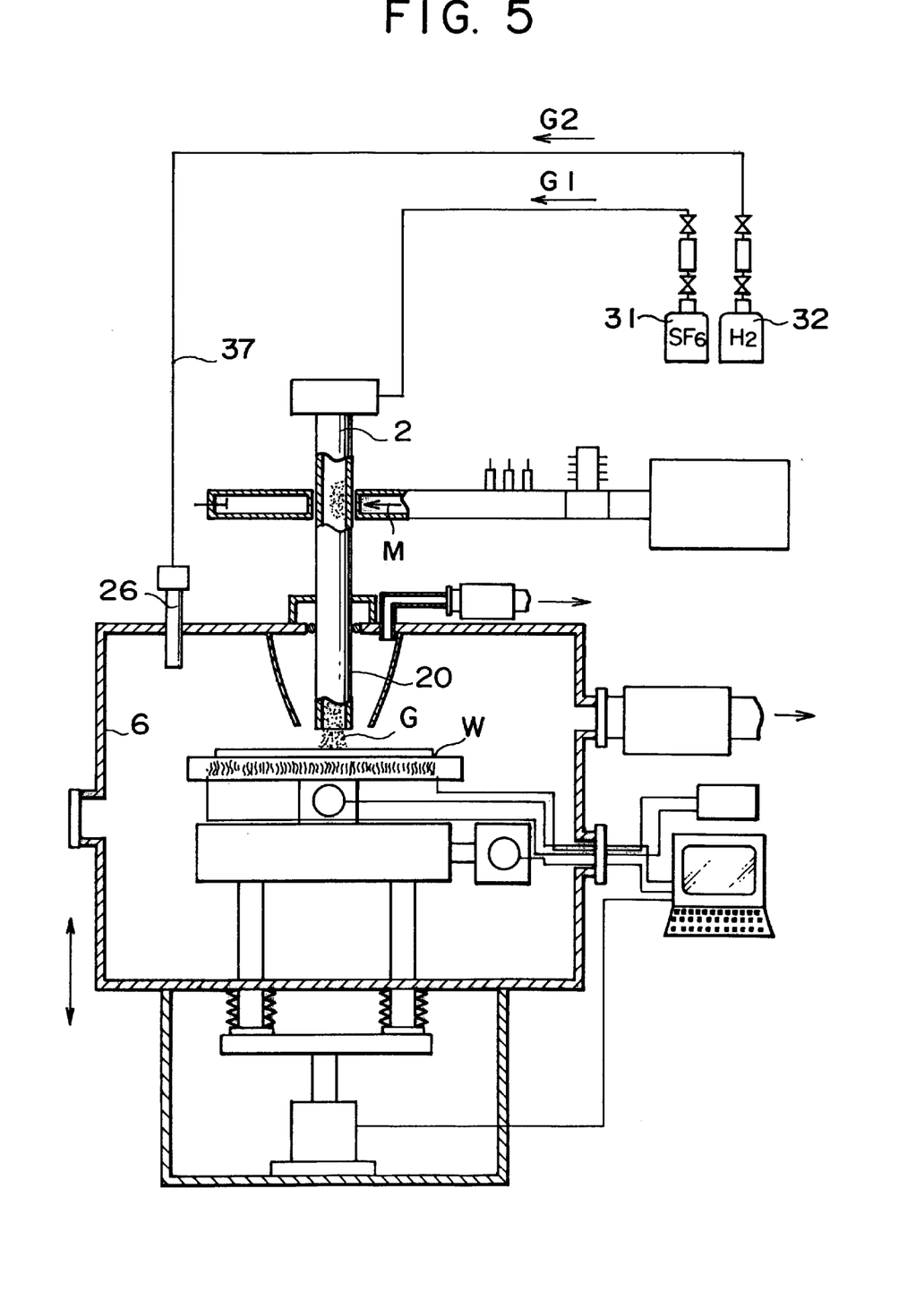
FIG. 5 is a structural view of a wafer etching apparatus for realizing a wafer etching method according to a fifth embodiment of the present invention.
Figure 6:
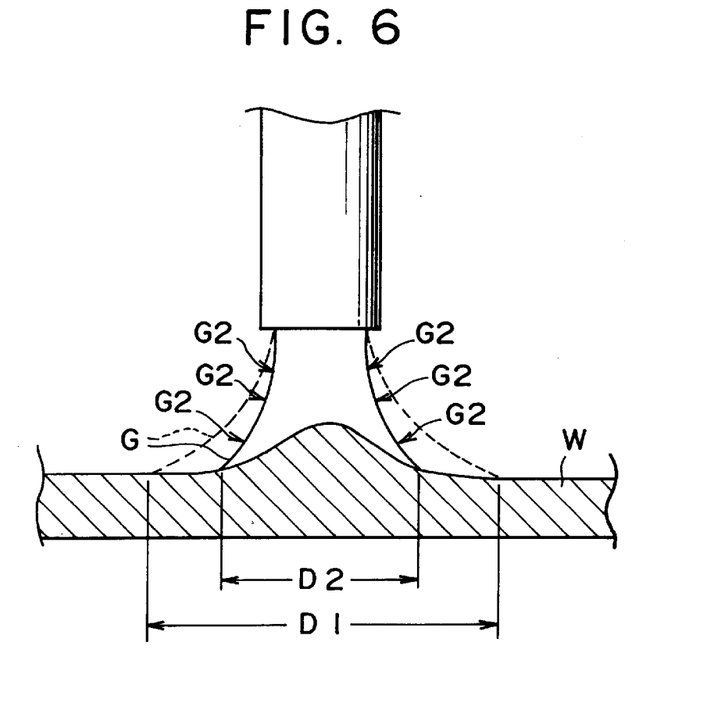
FIG. 6 is a schematic view for explaining the mode of operation of the fifth embodiment of the present invention.

FIG. 5 is a structural view of a wafer etching apparatus for realizing the wafer etching method according to a fifth embodiment of the present invention, while FIG. 6 is a schematic view for explaining the mode of operation of this embodiment.

This wafer etching apparatus, as shown in FIG. 5, is structured with a straight hydrogen gas feed pipe 26, connected through the feed pipe 37 to the bomb 32, attached to the chamber 6 and opening inside the chamber 6.

In this wafer etching apparatus, the $SF_6$ gas G1 is fed from the bomb 31 to the discharge tube 2 and the activated species gas G produced by the plasma discharge is sprayed from the nozzle portion 20.

In this state, as shown by the broken line in FIG. 6, the activated species gas G disperses widely and the etching diameter D1 ends up becoming extremely large.

Therefore, the $H_2$ gas G2 is fed from the bomb 32 to the hydrogen gas feed pipe 26 and $H_2$ gas G2 is discharged from the hydrogen gas feed pipe 26 to the chamber 6 to fill the chamber 6 with $H_2$ gas G2.

This being done, the dispersion of the activated species gas G is suppressed by the pressure of the $H_2$ gas G2 and, as shown by the solid line in FIG. 6, the etching diameter D2 becomes smaller.

Therefore, by setting the pressure of the $H_2$ gas G2 inside the chamber 6 at a predetermined level, it is possible to obtain a desired etching diameter D2 and as a result high precision local etching becomes possible.

The rest of the configuration, mode of operation, and advantageous effects are similar to those of the above first to fourth embodiments, so explanations thereof will be omitted.

(Sixth Embodiment)

The wafer etching method of tis embodiment differs from the first embodiment in the point that ammonia ($NH_3$) gas is used to etch wafer instead of $H_2$ gas used in the first embodiment.

Specifically, $NH_3$ gas is filled previously in the bomb 32 shown in FIG. 1. Then, at the time of feeding operation of the mixed gas, the ratio of $NH_3$ gas to the mixed gas of the $SF_6$ gas G1 and $NH_3$ gas fed into the discharge tube 2 is set to the value between 0.1 percent to 30 percent. In parallel with the operation of feeding the mixed gas, the microwave oscillator 4 is driven to perform the plasma generation step. When this happens, the activated species mixed gas G' comprising the activated species gas G and the HF as is sprayed from the opening of the nozzle portion 20 to the silicon wafer W side. Thereafter, by performing the spraying step same as in the first embodiment, the silicon wafer W can be flattened. Further, by causing plasma discharge of the mixed gas of the $SF_6$ gas G1 and the $NH_3$ gas, an activated species mixed gas G' containing the activated species gas G containing F radicals and HF gas produced by a reaction between the F radicals and $NH_3$ gas is blown onto the silicon wafer W, as is the case with fie first embodiment. Therefore, it is believed that the HF gas in the activated species mixed gas G' acts chemically and physically on the surface of the silicon wafer W and suppresses white turbidity on the surface of the silicon wafer W. Meanwhile, since the bonding force of N—H in $NH_3$ gas is weaker than that of H—H in $H_2$ gas, H ions can easily be separated from N ions. Therefore, HF gas can be generated rapidly, so that the suppressing effect on the generation of white turbidity is raised compared with the case of using $H_2$ gas.

Further, $NH_3$ gas can easily be handled compared with $H_2$ gas which has high reactivity with oxygen in an air. In addition, since $H_2$ gas is colorless and odorless, it is difficult to detect $H_2$ gas when $H_2$ gas is leaked from the bomb 32 or other structures. In contrast, since $NH_3$ as has an odor, $NH_3$ gas can be detected immediately when $NH_3$ gas is leaked from the bomb 32 or other structures.

Further, when the predetermined treatment is performed by feeding oxygen gas into the chamber 6 after the above mentioned flattening treatment, it is necessary to feed oxygen into the chamber 6 after exhausting $H_2$ gas filled within the chamber 6. However, $NH_3$ gas hardly reacts with oxygen, and so oxygen gas can be introduced immediately into the chamber 6 without exhausting $NH_3$ gas within the chamber 6.

The rest of the configuration and mode of operation are similar to those of the above first embodiment, so explanations thereof will be omitted.

Note that the present invention is not limited to the above embodiments. Various modifications and changes are possible within the scope of the gist of the invention.

For example, in the first to the fifth embodiments, as a means for executing the plasma generation step, use was made of a plasma generator 1 generating a microwave to generate plasma, but any means capable of generating activated species gas may be used. For example, it is possible to use various plasma generators such as a plasma generator which uses a high frequency to generate plasma to generate the activated species gas.

Further, in the above second embodiment, use was made of a heater 70 as a means for realizing the heating step, but the invention is not limited to this. For example, it is possible to use an infrared lamp etc. as the means for executing the heating step.

In the third to fifth embodiments, it is possible to provide a heating step as in the second embodiment so as to obtain a higher quality silicon wafer W.

Further, in the above sixth embodiment, use was made of $NH_3$ gas instead of $H_2$ gas as in the first embodiment, however, as in cases of using $NH_3$ gas in the above second to fifth embodiments, it is possible to obtain the same operation and advantageous effects as in the second to fifth embodiments.

Namely, in performing the method of wafer etching of the sixth embodiment by using $NH_3$ gas, the silicon wafer W is heated to the temperature between 60° C. and 170° C. by operating the heater 70 shown in FIG. 1. Due to this, it is possible to suppress the white turbidity on the surface of the silicon wafer W to an extent where it cannot be visually discerned even under a condenser type lamp.

By feeding the $SF_6$ gas G1 from the bomb 31 to the discharge tube 2 via the feed pipe 30 and by feeding $NH_3$ gas to the gas feed pipe 25 shown in FIG. 4, it is possible to spray the activated species mixed gas G' with added $NH_3$ gas from the nozzle portion 20 to the surface of the silicon wafer W.

Further, an activated species mixed gas G' including HF gas obtained by adding $NH_3$ gas to the $SF_6$ gas G1 (or activated species gas G) is sprayed from the nozzle portion 20 to the inside of the chamber 6 to make the inside of the chamber 6 an HF gas atmosphere of a predetermined concentration. Thereafter, only the activated species gas G produced by plasma discharge etches the silicon wafer W, so that it is possible to improve the etching rate.

In the structure as shown in FIG. 5, NH₃ gas can be discharged from the gas feed pipe 26 into the chamber 6 and the chamber 6 can be filled with NH₃ gas. Due to this, diffusion of the activated species gas G is suppressed by the pressure of NH₃ gas thereby enabling the etching diameter to be made small.

As explained above in detail, according to the wafer etching methods of the aspects of the invention, the wafer is etched by an activated species gas comprised mainly of sulfur hexafluoride, so it is possible to increase the etching rate of the wafer. Further, since the activated species gas is sprayed for etching from a nozzle portion far from the discharge position where the plasma is generated, there is no disturbance in the crystal structure of the wafer surface and a good quality wafer can be provided. Further, since the addition of hydrogen gas, ammonia gas or mixed gas containing one of these gases enables the occurrence of white turbidity of the wafer surface to be suppressed, it is possible to provide a high quality wafer.

Further, according to the wafer etching method according to the aspect of the invention, only the activated species gas produced by converting only sulfur hexafluoride to plasma is sprayed at the time of etching the wafer, so the etching by the activated species is not obstructed much at all by the hydrogen gas, ammonia gas or mixed gas containing one of these gases. As a result, it is possible to make the etching rate a desired level and possible to improve the efficiency of the work.

Further, according to the wafer etching method according to the aspect of the invention, not only is it possible to prevent the occurrence of white turbidity at the wafer surface, but also it is possible to control the etching diameter by the activated species gas to a desired size by the hydrogen gas, ammonia gas or mixed gas containing one of these gases, so high precision local etching becomes possible.

Further, according to the wafer etching method according to the aspect of the invention, it is possible to substantially completely suppress the occurrence of white turbidity at the surface of the wafer to an extent where the white turbidity cannot be visually discerned even under a condenser type lamp, so a further higher quality wafer can be provided.

What is claimed is:

1. A wafer etching method comprising:
   a plasma generation step for converting sulfur hexafluoride gas to plasma at a discharge position in a discharge tube to generate an activated species gas; and
   a spraying step for spraying the activated species gas onto a surface of a wafer having at least one relatively thick portion, in a state where a nozzle portion of the discharge tube leading the activated species gas generated at the discharge position to said surface of the wafer is made to face the at least one relatively thick portion of tie wafer, so as to locally etch the at least one relatively thick portion, wherein
   additive gas comprising hydrogen gas or ammonia gas is added to the activated species gas.

2. A wafer etching method as set forth in claim 1, wherein a nixed gas comprising the sulfur hexafluoride gas and the additive gas is fed to the discharge position in the discharge tube to generate an activated species mixed gas containing the activated species gas, and the activated species mixed gas is sprayed from the nozzle portion.

3. A wafer etching method as set forth in claim 1, wherein the additive gas is fed from a gas feed pipe connected to the inside of the nozzle portion to generate an activated species mixed gas containing the activated species gas, and the activated species mixed gas is sprayed from the nozzle portion.

4. A wafer etching method as set forth in claim 2, wherein the activated species mixed gas is sprayed from the nozzle portion so as not to strike the wafer to make the area around the wafer an atmosphere of the activated species mixed gas, and then just sulfur hexafluoride gas is converted to plasma to generate an activated species gas for etching the wafer.

5. A wafer etching method as set forth in claim 2, wherein the additive gas is fed in an amount between 0.1 to 30 percent with respect to the total of the amount of additive gas fed and the amount of sulfur hexafluoride gas fed.

6. A wafer etching method as set forth in claim 1, wherein the additive gas is fed around the activated species gas sprayed from the nozzle portion.

7. A wafer etching method as set forth in claim 1, further comprising a heating step for heating the surface of the wafer to a predetermined temperature.

8. A wafer etching method as set forth in claim 7, wherein the surface oft he wafer is heated to a temperature between 60° C. to 170° C. in the heating step.

* * * * *